(12) United States Patent
Atsumi (10) Patent No.: US 8,253,469 B2
(45) Date of Patent: Aug. 28, 2012

(54) SEMICONDUCTOR DEVICE

(75) Inventor: Tomoaki Atsumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/568,378

(22) Filed: Sep. 28, 2009

(65) Prior Publication Data

US 2010/0079179 A1 Apr. 1, 2010

(30) Foreign Application Priority Data

Sep. 30, 2008 (JP) ................................. 2008-252073

(51) Int. Cl.
*G06F 1/04* (2006.01)
*H03K 3/00* (2006.01)
(52) U.S. Cl. ......... 327/295; 327/291; 327/293; 327/296
(58) Field of Classification Search .................. 327/165, 327/166, 291, 374, 178; 326/93–98; 716/6
See application file for complete search history.

(56) References Cited

U.S. PATENT DOCUMENTS

| | | | |
|---|---|---|---|
| 4,947,407 A | | 8/1990 | Silvian |
| 5,818,881 A | * | 10/1998 | Guiffant et al. ............... 375/334 |
| 5,847,662 A | * | 12/1998 | Yokota et al. .............. 340/10.34 |
| 2007/0290207 A1 | | 12/2007 | Atsumi et al. |
| 2008/0088367 A1 | * | 4/2008 | Atsumi ........................ 329/310 |

FOREIGN PATENT DOCUMENTS

| | | |
|---|---|---|
| EP | 0 412 427 A2 | 2/1991 |
| JP | 64-24632 | 1/1989 |
| JP | 3-76346 | 4/1991 |
| JP | 10-107859 | 4/1998 |
| JP | 11-4185 | 1/1999 |
| JP | 2003-244014 | 8/2003 |
| JP | 2003-333112 | 11/2003 |
| JP | 2006-109276 | 4/2006 |
| JP | 2006109276 A  * | 4/2006 |
| JP | 2008-10849 | 1/2008 |
| WO | WO 2006/038710 A1 | 4/2006 |

OTHER PUBLICATIONS

International Search Report re application No. PCT/JP2009/065617, dated Oct. 13, 2009.
Written Opinion re application No. PCT/JP2009/065617, dated Oct. 13, 2009.

(Continued)

*Primary Examiner* — Lincoln Donovan
*Assistant Examiner* — Brandon S Cole
(74) *Attorney, Agent, or Firm* — Husch Blackwell LLP (57) ABSTRACT

It is an object of the present invention to provide a semiconductor device that has a simple circuit structure, a small scale, and low power consumption, and can generate a desired clock signal. The semiconductor device has a clock generation circuit which generates a clock signal by dividing a modulated carrier wave, a divider circuit which generates a first divided signal by dividing a carrier wave, and a correction circuit which generates a second divided signal by further dividing the first divided signal, and has a function of performing correction for inverting the second divided signal in a period corresponding to a half period of the clock signal during modulation of the carrier wave and selecting whether the correction is performed or not.

23 Claims, 9 Drawing Sheets

OTHER PUBLICATIONS

International Search Report re application No. PCT/JP2005/018728, dated Dec. 27, 2005.
Written Opinion re application No. PCT/JP2005/018728, dated Dec. 27, 2005.
Man, A.S.W. et al, "Design and Implementation of a Low-Power Baseband-System for RFID Tag," ISCAS 2007: IEEE International Symposium on Circuits and Systems, 2007, pp. 1585-1588.

* cited by examiner

FIG. 1

FIG. 2A carrier wave 109
domodulated signal 110
synchronization signal 111
initial synchronization signal 313
correction timing signal 112
set correction signal 114
reset correction signal 115
clock signal 116

SEMICONDUCTOR DEVICE

TECHNICAL FIELD

The present invention relates to a semiconductor device that generates a clock signal from a carrier wave when using a communication system conforms to ISO/IEC14443 or ISO/IEC18092, which are standards for proximity, and ISO/IEC15693, ISO/IEC18000-3, or the like, which are standards for vicinity.

BACKGROUND ART

In recent years, identification technology where ID (identification number) is assigned to each object so as to reveal information thereon such as history which is utilized for production management and the like has attracted attention. Above all, semiconductor devices capable of wireless data transmission/reception have developed. As such a semiconductor device, in particular, an RFID (radio frequency identification) tag (also referred to as an ID tag, an IC tag, an IC chip, an RF tag, a wireless tag, an electronic tag, a wireless chip or a transponder) and the like begin to be introduced into companies, markets, and the like.

Figure 3A:
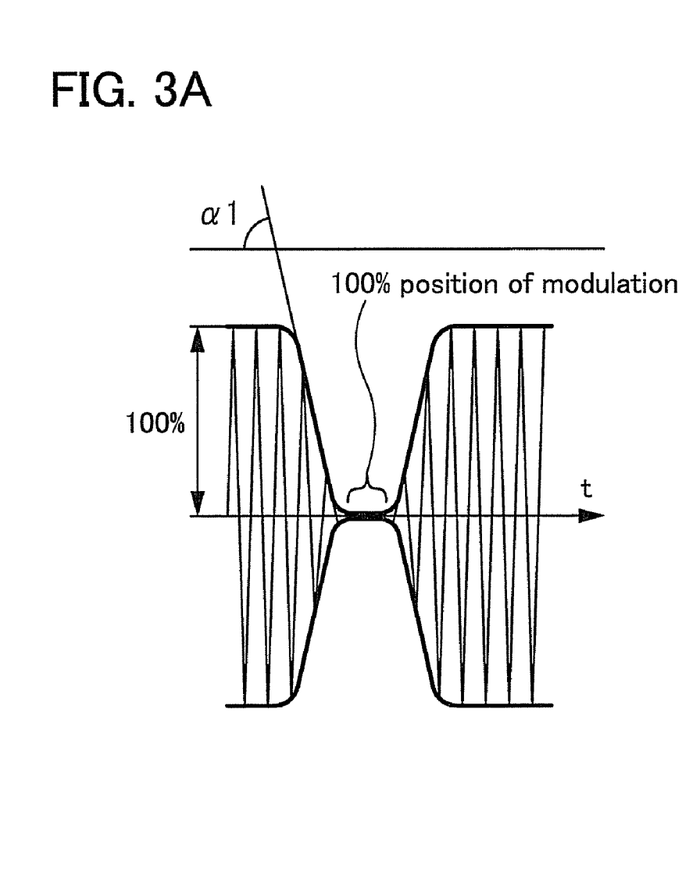
FIGS. 3A and 3B are diagrams illustrating 100% modulation and 10% modulation of the carrier wave.
Figure 3B:
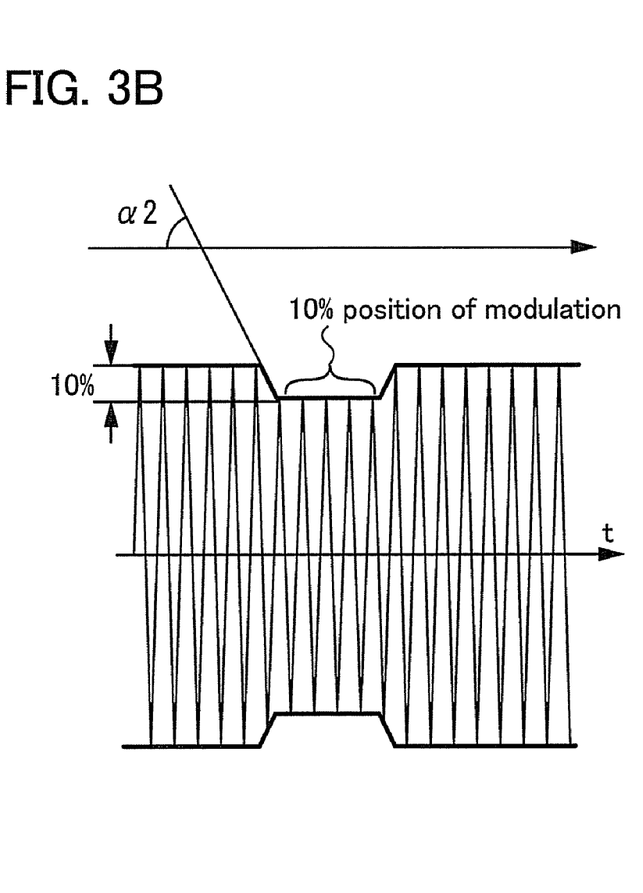

A background art will be given using a communication system which conforms to ISO/IEC15693 which is one of RFID standards as an example. This communication system encodes data by a pulse position modulation method, which modulates a carrier wave with a frequency of 13.56 MHz at 100% or 10% and changes the position of modulation to distinguish data. An example of the case where the carrier wave is modulated at 100% is shown in FIG. 3A and an example of the case where the carrier wave is modulated at 10% is shown in FIG. 3B. A carrier wave with a modulation degree of 100% includes a state having no amplitude, while a carrier wave with a modulation degree of 10% includes a state where amplitude is changed by 10%.

The method called 4PPM (pulse position modulation) which is one of the pulse position modulation methods conforming to ISO/IE15693 is described with reference to FIG. 4A.

Figure 4A:
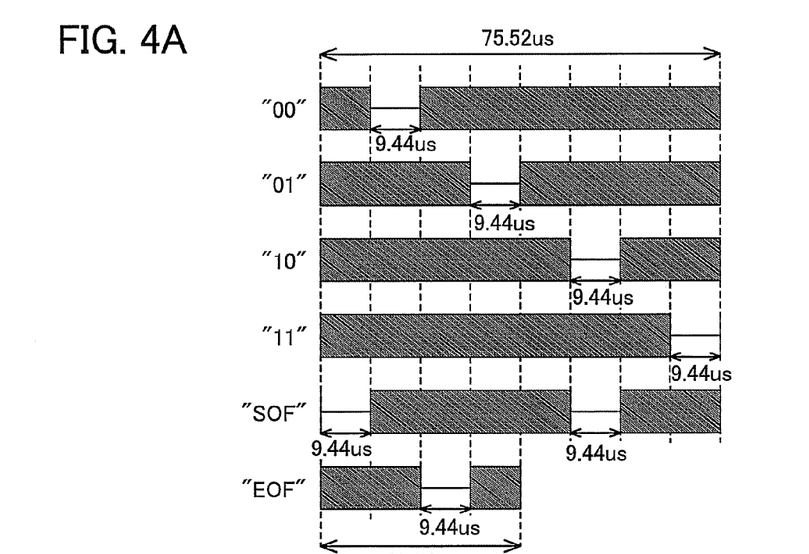
FIGS. 4A and 4B are diagrams illustrating a pulse position modulation method of 4PPM.

In FIG. 4A, a rectangle portion represents a carrier wave with a frequency of 13.56 MHz and a line between rectangles represents a modulated portion. Two-bit value "00", "01", "10", and "11"; and frame codes "SOF" and "EOF" are determined by respective locations of 9.44 μs of the modulated portions in 75.52 μs of duration. Note that the duration of EOF is 37.76 μs.

In FIG. 4A, "SOF" is a signal representing the start of a frame and is sent before data is sent while "EOF" is a signal representing the end of a frame and is sent after data is sent.

A transmission-side reader/writer encodes a flag signal and data such as a command by a pulse position modulation method, modulates a carrier wave with the encoded data, and sends the modulated carrier wave to an RFID tag. A reception-side RFID tag demodulates the modulated carrier wave and reads out a pulse position to obtain data.

Figure 4B:
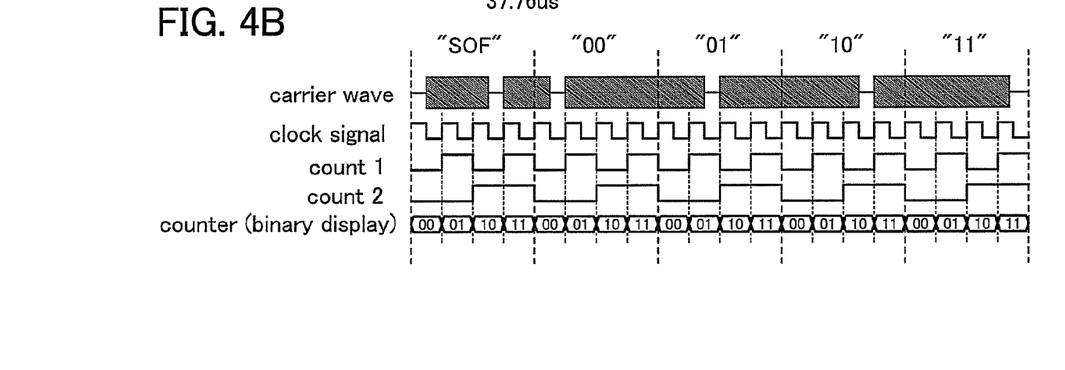

A common method for obtaining data on the RFID tag side is described below with reference to FIG. 4B. Note that data is sent with a carrier wave modulated at 100% by the pulse position modulation method. In an example of FIG. 4B, Two-bit value "00", "01", "10", and "11" are sent as data after "SOF" which is sent as a starting signal.

Note that a reference clock signal is synchronized with the portions of a carrier wave, which is modulated at 100%. Further, a half period of the clock signal has the same length as the width of the pulse modulated at 100%. A counter which performs two-bit count with the clock signal is provided as shown in FIG. 4B, count 1 and count 2. The counter counts repeatedly from "00" to "11" while "00" indicates the first position of modulation at 100% in "SOF". The timing where each piece of data is modulated at 100% corresponds to a counter value. Data can be obtained from the signal modulated with the pulse position modulation method in accordance with the counter value which is obtained when a carrier wave is modulated at 100%.

An RFID tag needs a reference clock signal to extract data from a carrier wave. However, the signal which can be received by RFID tag from an antenna, is only the carrier wave and a demodulated signal which is obtained by demodulating the carrier wave. Therefore, a reference clock signal for detecting a timing of modulating the carrier wave (hereinafter the timing is also referred to a pulse position) needs to be generated in the RFID tag.

A PLL (phase locked loop) circuit can be used to obtain the reference clock signal. A PLL circuit detects a phase difference between an input signal and an output signal and controls a VCO (voltage controlled oscillator) from which the output signal is generated, so that the output signal with a frequency precisely synchronized with the input signal can be obtained.

The clock signal which is used for internal operation of the RFID tag can be generated by obtaining a carrier wave or a waveform synchronized with a demodulated signal with the use of a PLL circuit. The RFID tag which generates the clock signal using the PLL circuit is disclosed, for example, in FIG. 9 of Patent Document 1 (Japanese Published Patent Application No. 2008-010849).

REFERENCE

[Patent Document 1] Japanese Published Patent Application No. 2008-010849

DISCLOSURE OF INVENTION

A semiconductor device such as an RFID tag receives a carrier wave sent from a reader/writer, rectifies, smoothes, and stores the carrier wave in a capacitor to use it as power source in the semiconductor device. Since there is limitation on the size of the semiconductor device, significantly large capacitor cannot be formed therein. Therefore, there is limitation on the power supply of the semiconductor device.

Note that, the PLL circuit is generally complicated and large in scale, and consumes much power; therefore, the PLL circuit is not suitable to be incorporated in a semiconductor device having limited power supply, like an RFID tag. It would therefore be good if the clock signal can be generated from a carrier wave without using a PLL circuit, however, there are the following problems.

In the case where a clock signal is generated by dividing a carrier wave part of which is modulated at 100%, a carrier wave has no amplitude during the period in which the carrier wave is modulated at 100%. Since there is no amplitude, the clock signal obtained by dividing the carrier wave does not change during the period, so that the pulse width of the obtained clock pulse gets longer.

An aspect of the pulse width getting longer is described with reference to simulation results shown in FIG. 5 and FIG. 6.

Figure 5:
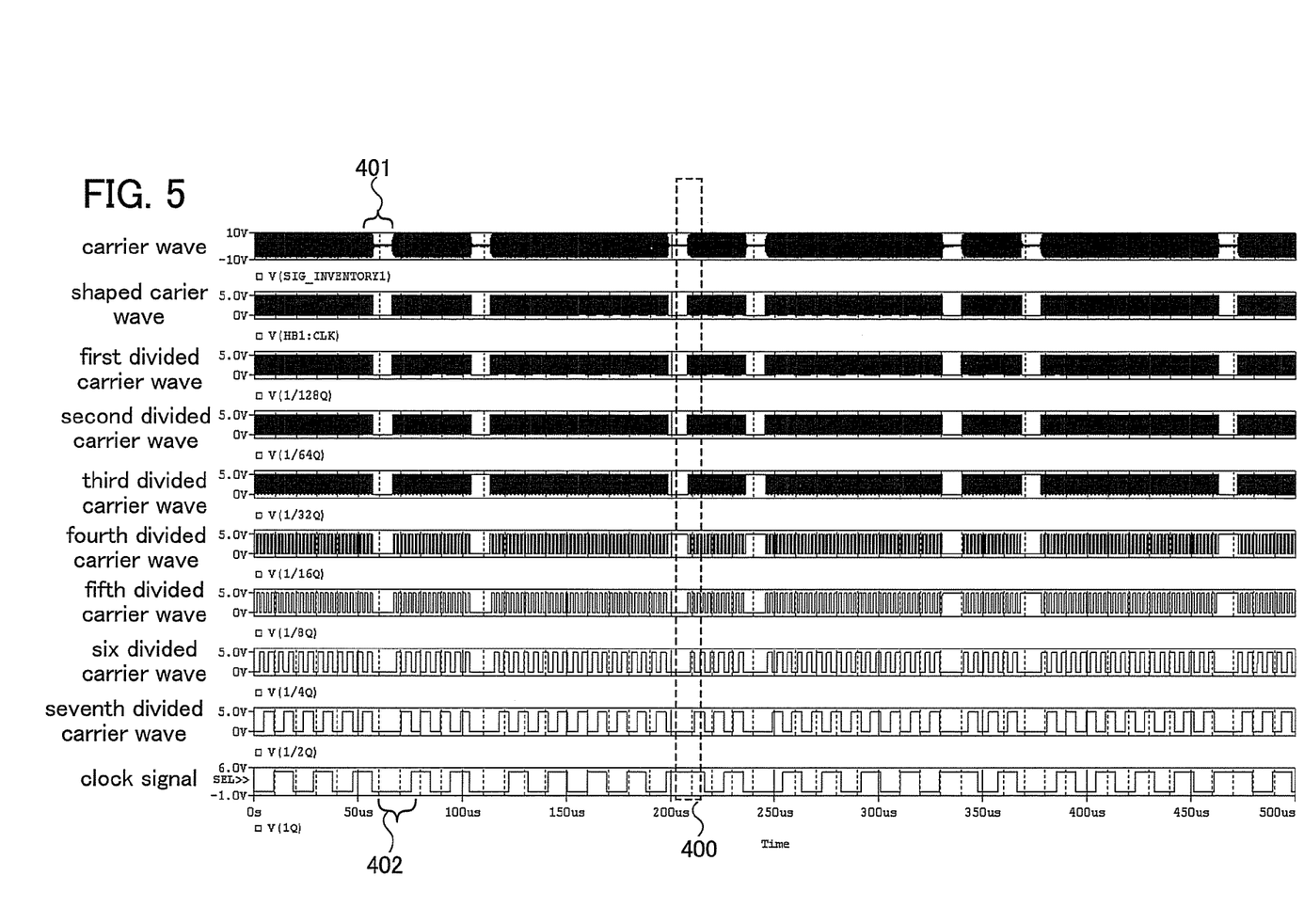
FIG. 5 is a diagram illustrating the waveforms of a conventional clock signal.
Figure 6:
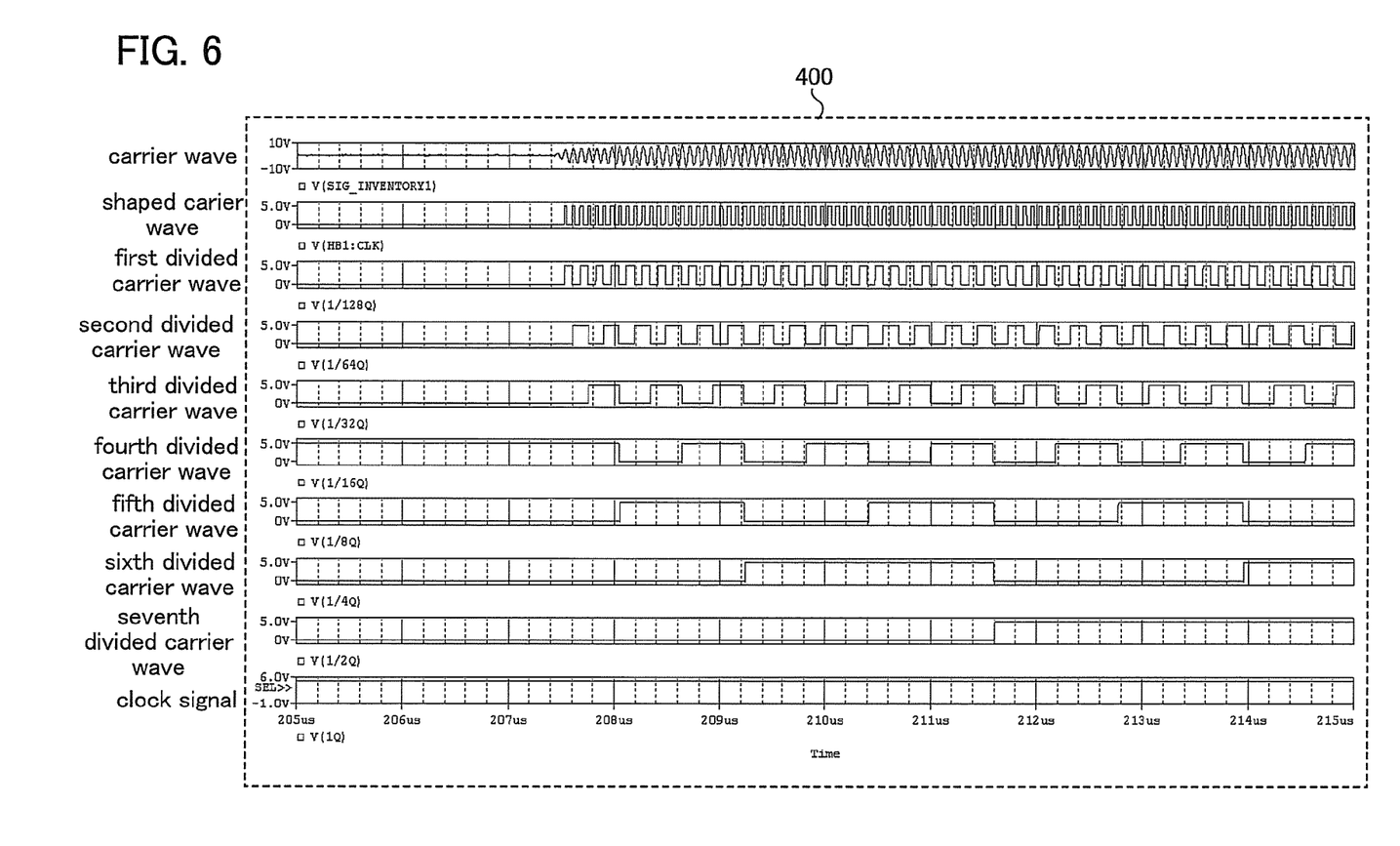
FIG. 6 is an enlarged view of part of the waveforms shown in FIG. 5.

FIG. 6 illustrates an enlarged view of a dotted line portion 400 of FIG. 5, which indicates the simulation results.

In FIG. 5, the clock signal is generated by dividing the carrier wave by 2 eight times. Since the carrier wave has no amplitude during a period 401 in which a carrier wave is modulated at 100%, each waveform (first divided carrier wave to seventh divided carrier wave) divided by 2 stays the same without changing. The generated clock signal does not change either during the period in which a carrier wave is modulated at 100%, therefore, the generated clock signal has a waveform 402 whose pulse width gets longer.

In order to detect a timing (pulse position) of modulation in a carrier wave, a counter which counts at a constant period, and a clock signal whose period does not change for count at a constant period are required.

However, as set forth above, the period (timing) of the clock signal obtained by the 100% modulation changes during the modulation of a carrier wave at 100% because a pulse width gets longer, whereby a position which is modulated at 100% cannot be precisely read out. Then, in order to read data out precisely from the carrier wave (radio waves) sent from the reader/writer, the clock signal whose period does not change needs to be generated from the carrier wave part of which is modulated at 100%.

Therefore, the clock signal obtained by dividing the carrier wave part of which is modulated at 100%, needs to be corrected. In other words, a desired clock signal needs to be generated by inverting forcibly the clock signal by a half period thereof at a portion where the waveform of the clock signal gets longer in FIG. 5.

In the case where the 10% modulation is employed, the semiconductor device (for example, an RFID tag) can continuously receive a carrier wave because of its low modulation degree, unlike the 100% modulation. Accordingly, when the clock signal is generated by dividing the carrier wave part of which is modulated at 100%, the pulse width of the clock signal does not get longer, unlike the case of the 100% modulation described above. Therefore, correction for inverting the clock signal forcibly by a half period during the modulation of a carrier wave is not required.

Further, the slope of modulated carrier wave (shown by $\alpha 1$ and $\alpha 2$ in FIG. 3A and FIG. 3B) may differ depending on the structure of a reader/writer or the specification of a reader/writer. Here, the potential (hereinafter referred to as threshold) which is a border for determining whether a demodulated signal has a low potential (hereinafter referred to as Low) or a high potential (hereinafter referred to as High) when a carrier wave is demodulated, varies depending on the level of the power supply voltage generated in the semiconductor device. Accordingly, when the power supply voltage generated in the semiconductor device varies because of communication distance or environment, the threshold varies. In particular, in the case where the slope of modulated carrier wave is gradual, the width (pulse width) of the demodulated signal corresponding to the modulated portion in the carrier wave may vary more easily, if the threshold varies when the carrier wave is demodulated.

In the case where the width (pulse width) of the demodulated signal corresponding to the modulated portion in a carrier wave gets shorter than normal, a pulse which repeats a constant period synchronizing with rising of the demodulated signal corresponding to the modulated portion as a reference in the carrier wave, is generated to be used as a clock signal. Then, after the rising of the demodulated signal, the clock signal rises before falling of the demodulated signal. That is to say, correction for inverting the clock signal at a timing of turning the demodulated signal to low is not required because the clock signal turns to High before the demodulated signal turns to Low. In other words, correction for inverting the clock signal forcibly by a half period during the modulation of a carrier wave is not required.

As described above, correction of the clock signal obtained by dividing the carrier wave is not required in some cases: the case where a carrier wave part of which is demodulated at 10% is inputted; and the case where the width (pulse width) of the demodulated signal corresponding to the demodulated portion of the carrier wave is shorter than normal. Therefore, if the signal obtained by dividing the carrier wave is always corrected in the period where the carrier wave is modulated, a desired clock signal is not obtained.

In view of the above-described conditions, it is an object of the present invention to provide the semiconductor device that has a simple circuit structure, a small scale, and low power consumption, and can generate a desired clock signal.

A semiconductor device according to one embodiment of the present invention includes a clock generation circuit which generates a clock signal by dividing a modulated carrier wave. The clock generation circuit has the following features.

The clock generation circuit includes a divider circuit and a correction circuit. The divider circuit generates a first divided signal by dividing a carrier wave. The correction circuit has a function of generating a second divided signal by further dividing the signal divided by the divider circuit and performing correction for inverting the second divided signal in a period corresponding to a half period of the clock signal during the modulation of the carrier wave. Moreover, the correction circuit has a function of selecting whether the correction is necessary or not.

The selection whether the correction is performed or not can be controlled by using a set correction signal and reset correction signal which are generated by using a carrier wave and a demodulated signal generated by demodulating the carrier wave.

Note that the period of the first divided signal may correspond to a half period of the clock signal.

For modulating a carrier wave, 100% modulation method and 10% modulation method can be switched.

The semiconductor device that is one embodiment of the present invention may conform to the ISO/IEC15693 communication standard.

In the semiconductor device that is one embodiment of the present invention, the divider circuit and the correction circuit may have D-type flip flops.

The semiconductor device that is one embodiment of the present invention may be an RFID tag.

Even when the 10% modulation method is employed, the clock signal having a constant period can be generated. In addition, even though the width (pulse width) of the demodulated signal corresponding to the modulated portion in a carrier wave varies, the clock signal having a constant period at some level can be generated.

A desired clock signal can be generated by incorporating the clock generation circuit having the above-described functions into a semiconductor device such as an RFID tag, even when the electric power generated by the semiconductor device such as an RFID based on a carrier wave varies in a greater or less degree. Therefore, the semiconductor device having a wide operating range can be realized.

Further, the clock signal having a constant period can be generated in both cases of 100% modulation and 10% modulation, so that the semiconductor device which responses correctly can be realized.

BEST MODE FOR CARRYING OUT THE INVENTION

The embodiments of the present invention disclosed will be described hereinafter referring to the accompanying drawings. Note that it is easily understood by those skilled in the art that the present invention can be implemented in many different modes and modes and details disclosed herein can be modified in a variety of ways without departing from the purpose and scope of the present invention. Therefore, the present invention should not be construed as being limited to the description in the following embodiment. Through the drawings of the embodiment, the same components or components having the same functions are denoted by similar reference numerals and will not be further explained.

Embodiment 1

Figure 1:
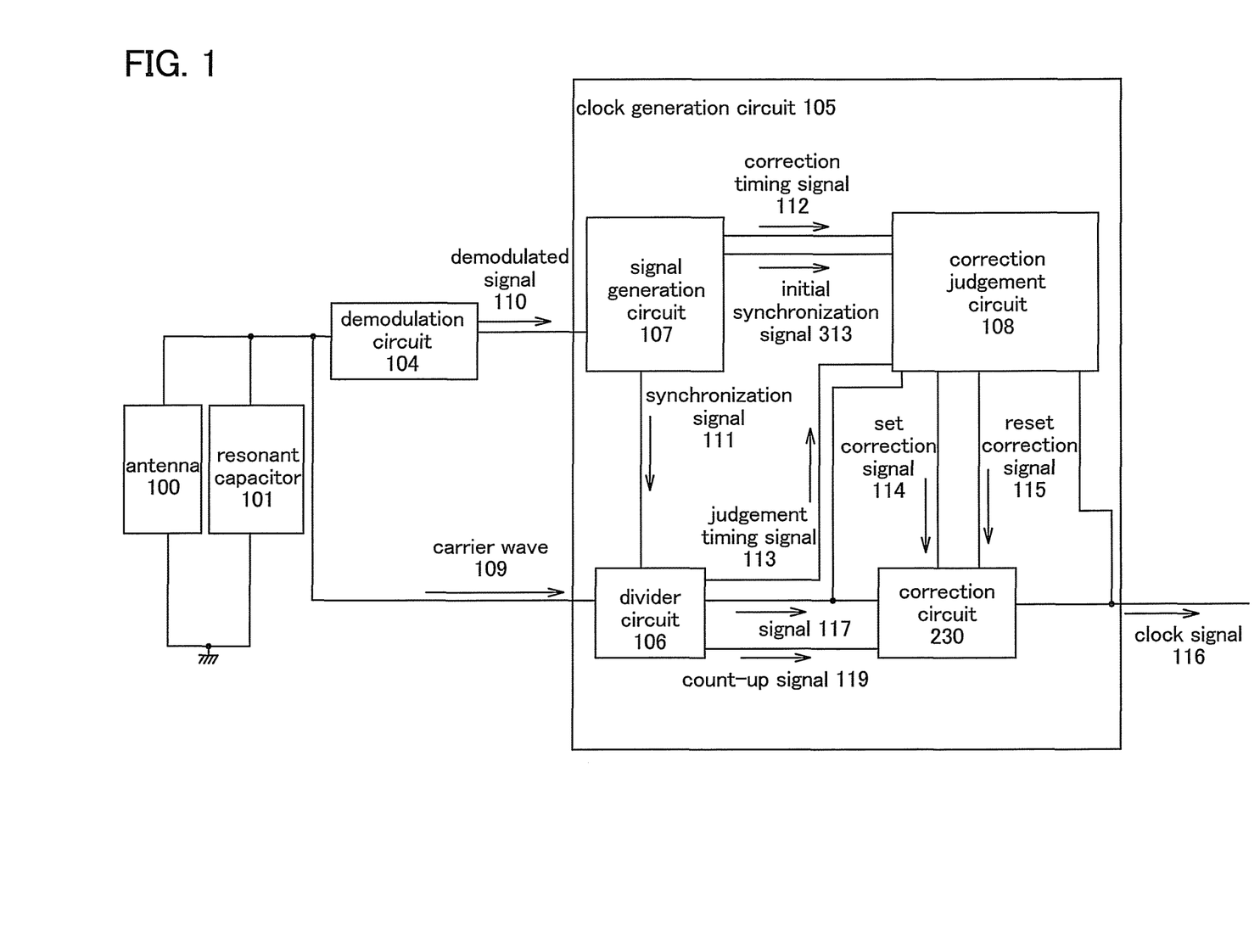
FIG. 1 is a block diagram illustrating a circuit structure of a semiconductor device according to one embodiment of the present invention.
Figure 2A:
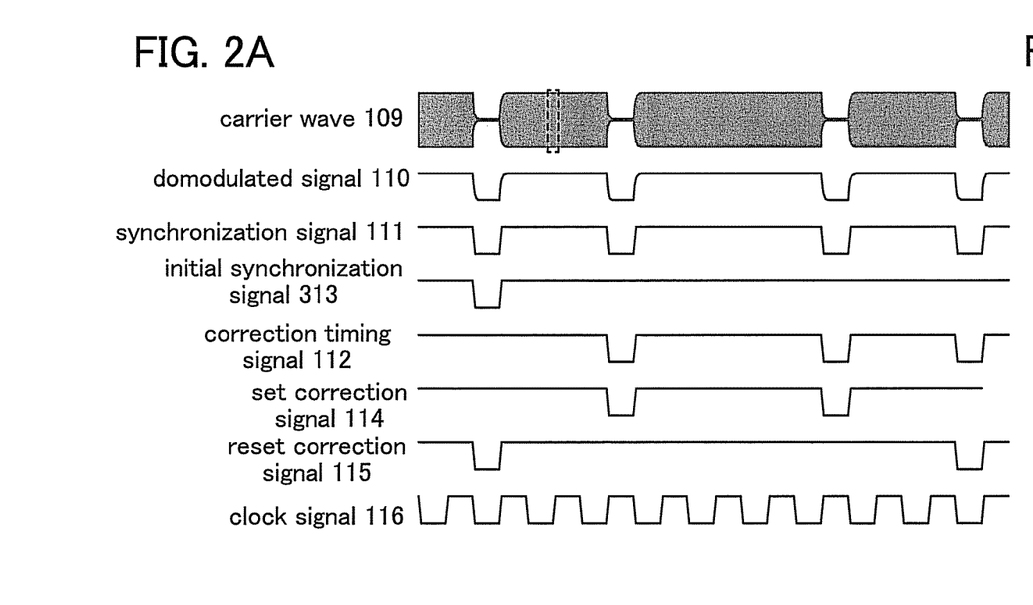
FIGS. 2A and 2B are diagrams illustrating a driving method of a semiconductor device according to one embodiment of the present invention.
Figure 2B:
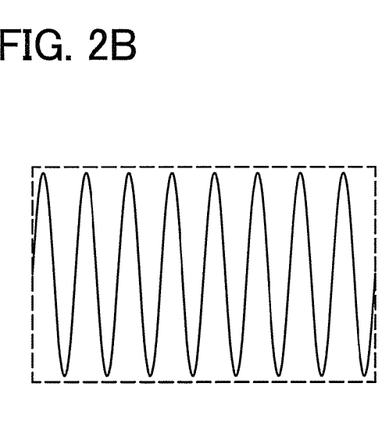

A structure and operation of a clock generating circuit provided in a semiconductor device that is one embodiment of the present invention is described with reference to FIG. 1 and FIGS. 2A and 2B. FIG. 1 shows an example in which the semiconductor device that is one embodiment of the present invention is an RFID tag. In FIG. 1, a clock generation circuit 105 includes a signal generation circuit 107, a divider circuit 106, a correction judgement circuit 108, and a correction circuit 230. FIG. 2A illustrates the waveforms of each signals of the RFID tag shown in FIG. 1. An enlarged view of a portion surrounded by a dotted line in FIG. 2A is shown in FIG. 2B.

An antenna 100 and a resonant capacitor 101 receive a carrier wave transmitted from a reader/writer. A carrier wave 109 received is inputted to a demodulation circuit 104 and a clock generation circuit 105. The demodulation circuit 104 generates a demodulated signal 110 based on the carrier wave 109 part of which is modulated at 100% or 10%.

The signal generation circuit 107 generates a synchronization signal 111 for determining the operating timing of the divider circuit 106 based on the demodulated signal 110, an initial synchronization signal 313 and a correction timing signal 112 which are to be inputted to the correction judgement circuit 108.

The divider circuit 106 divides the carrier wave 109 until a half period of the aimed clock signal 116 is obtained. At that time, a signal 117 obtained by dividing the carrier wave 109 is synchronized with the demodulated signal 110 based on the synchronization signal 111 outputted from the signal generation circuit 107. In addition, the divider circuit 106 outputs a judgement timing signal 113 and a count-up signal 119.

The initial synchronization signal 313, the correction timing signal 112, the judgement timing signal 113, and the clock signal 116 are inputted to the correction judgement circuit 108. The correction judgement circuit 108 judges whether set correction or reset correction is performed and generates a set correction signal 114 or a reset correction signal 115.

Whether set correction or reset correction is performed is judged by maintaining a state of the clock signal 110 in the correction judgement circuit 108 at a certain timing and judging the maintained state of the clock signal 116 at a timing of judgement timing signal 113. By fixing as appropriate the timing of the determination the correction judgement circuit can judge as appropriate whether set correction or reset correction is performed and generate the desired clock signal 116 even when the width (pulse width) of the demodulated signal which corresponds to a modulated portion in the carrier wave 109 fluctuates in some degree.

The signal 117 outputted from the divider circuit 106, and the set correction signal 114 and reset correction signal 115 outputted from the correction judgement circuit are inputted to the correction circuit 230. When the correction signal (set correction signal 114 or the reset correction signal 115) is not active, the correction circuit 230 receives and further divides the signal 117 outputted from the divider circuit 106 and outputs the signal 117 as the clock signal 116.

When the set correction signal 114 is active, the correction circuit 230 puts the clock signal 116 in a set state which means High. On the other hand, when the reset correction signal 115 is active, the correction circuit 230 puts the clock signal 116 in a reset state which means Low.

Thus, the set correction signal 114 and the reset correction signal 115 allow the correction circuit 230 to change forcibly the state of its output signal. The clock signal 116 obtained in such a manner does not have a longer pulse width and can generate the clock signal 116 having a constant period, which is necessary for each circuit in an MD tag.

In this embodiment, an RFID tag is shown as an example of a semiconductor device. However, the present invention is not limited to the RFID tag and can be applied to the semiconductor device which generates the clock signal based on a carrier wave.

Embodiment 2

Each circuit structure of the clock generation circuit 105 provided in the semiconductor device that is one embodiment of the present invention are described in detail.

Figure 7A:
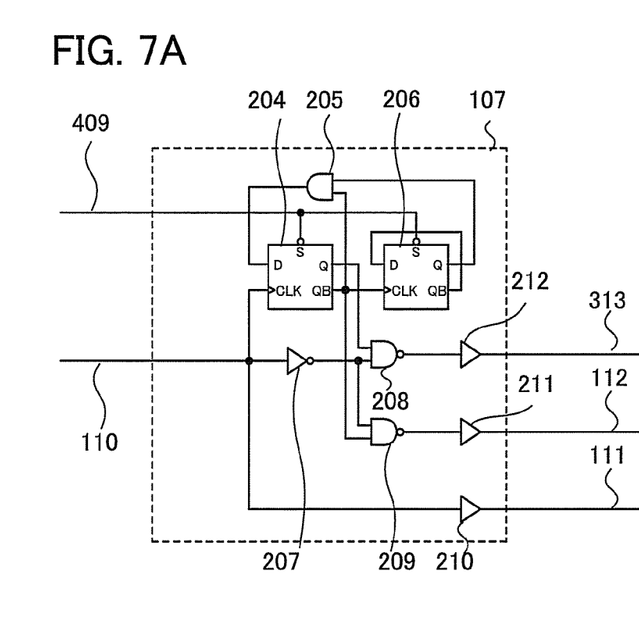
FIGS. 7A and 7B are diagrams each illustrating a specific example of a signal generation circuit and a correction judgement circuit according to one embodiment of the present invention.

FIG. 7A illustrates an example of a circuit structure of the signal generation circuit 107 shown in FIG. 1. The demodulated signal 110 and a reset signal 409 are inputted to the signal generation circuit 107 and the signal generation circuit 107 generates the synchronization signal 111, the correction timing signal 112, and the initial synchronization signal 313.

The signal generation circuit 107 shown in FIG. 7A has a D-type flip flop 204, a D-type flip flop 206, an AND circuit 205, a NAND circuit 208, a NAND circuit 209, an inverter 207, a buffer 210, a buffer 211, and a buffer 212. The D-type flip flop 204 and the D-type flip flop 206 have an asynchronous negative set, and they constitute a two-bit counter. A terminal QB of the first stage D-type flip flop 204 is electrically connected to a terminal CLK of the second stage D-type flip flop 206. An output terminal QB of the second stage D-type flip flop 206 is electrically connected to an input terminal D of the second stage D-type flip flop 206. A signal outputted from the output terminal QB of the first stage D-type flip flop 204 and a signal outputted from the output terminal Q of the second D-type flip flop 206 are inputted to the AND circuit 205. And after carrying out AND operation, a signal outputted from the AND circuit 205 is inputted to the input terminal D of the first D-type flip from 204.

The demodulated signal 110 is inputted to the terminal CLK of the first D-type flip flop 204, the inverter 207, and the buffer 210. An output signal of the buffer 210, which is obtained by amplifying the demodulated signal 110 is inputted to the divider circuit 106 as the synchronization signal 111.

One of two input terminals of the NAND circuit 208 is electrically connected to the output terminal Q of the first stage D-type flip flop 204, and the other is electrically connected to an output of the inverter 207. The output signal of the NAND circuit 208 is amplified by the buffer 212 and inputted to the correction judgement circuit 108 as the initial synchronization signal 313. The initial synchronization signal 313 is the signal obtained by taking out only the first pulse among a plurality of pulses included in the demodulated signal 110 (the modulated portions in a carrier wave, that is, the pulses corresponding to the Low parts in the demodulated signal) is extracted (see FIG. 2A).

One of two input terminals of the NAND circuit 209 is electrically connected to the output terminal QB of the first stage D-type flip flop 204, and the other is electrically connected to the output of the inverter 207. An output signal of the NAND circuit 209 is amplified by the buffer 211 and inputted to a correction judgement circuit 108 as a correction timing signal 112. The correction timing signal 112 is the signal obtained by taking out a plurality of pulses (the modulated portions in the carrier wave, that is, the pulses corresponding to the Low parts of the demodulated signal) except the first pulse (see FIG. 2A).

Figure 7B:
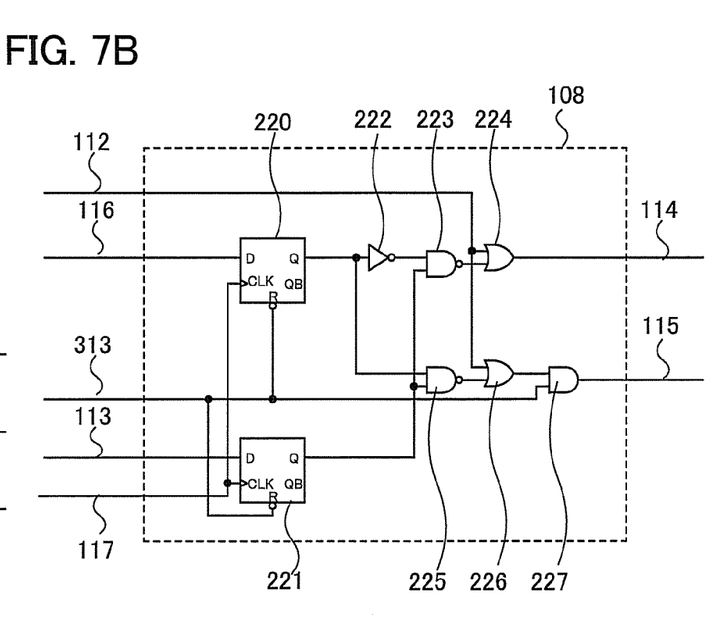

FIG. 7B illustrates an example of the circuit structure of a correction judgement circuit 108. The correction timing signal 112, the judgement timing signal 113, the initial synchronization signal 313, the signal 117, and the clock signal 116 are inputted to the correction judgement circuit 108 and the correction judgement circuit 108 generates a set correction signal 114 and a reset correction signal 115.

The correction judgement circuit 108 shown in FIG. 7B has a D-type flip flop 220, a D-type flip flop 221, an AND circuit 227, a NAND circuit 223, a NAND circuit 225, an inverter 222, an OR circuit 224, and an OR circuit 226. The D-type flip flop 220 and the D-type flip flop 221 have an asynchronous negative set.

In the D-type flip flop 220, the clock signal 116 is inputted to a terminal D, the initial synchronization signal 313 is inputted to the terminal R, and the signal 117 is inputted to a terminal CLK. In the D-type flip flop 221, the judgement timing signal 113 is inputted to a terminal D, the initial synchronization signal 313 is inputted to a terminal R, and the signal 117 is inputted to a terminal CLK.

An input of the inverter 222 is electrically connected to an output terminal Q of the D-type flip flop 220. One of two input terminals of the NAND circuit 223 is electrically connected to an output of the inverter 222, and the other is electrically connected to an output terminal Q of the D-type flip flop 221.

One of two input terminals of the OR circuit 224 is electrically connected to an output of the NAND circuit 223, and the correction timing signal 112 is inputted to the other. An output signal of the OR circuit 224 is inputted to the correction circuit 230 as the set correction signal 114.

One of two input terminals of the NAND circuit 225 is electrically connected to the output terminal Q of the D-type flip flop 220, and the other is electrically connected to the output terminal Q of the D-type flip flop 221. One of two input terminals of the OR circuit 226 is electrically connected to an output of the NAND circuit 225, and the correction timing signal 112 is inputted to the other. A signal outputted from the OR circuit 226 is inputted to the correction circuit 230 as the reset correction signal 115 after carrying out AND operation with the initial synchronization signal 313.

A signal obtained by latching the judgement timing signal 113 with the signal 117 can be obtained from the output terminal Q of the D-type flip flop 221. The period where the signal outputted from the output terminal Q of the D-type flip flop 221 is High is the period where one of the set correction signal 114 and the reset correction signal 115 can be outputted. On the other hand, the period where the signal outputted from the output terminal Q of the D-type flip flop 221 is Low is the period where neither of the set correction signal 114 and the reset correction signal 115 can be outputted. The signal outputted from the output terminal Q of the D-type flip flop 221 allows the set correction signal 114 or the reset correction signal 115 to be generated. The set correction signal 114 or the reset correction signal 115 are inputted to the correction circuit 230 so that the correction circuit 230 can select only proper timing and then perform correction.

The signal obtained by latching the clock signal 116 with the signal 117 can be obtained from the output terminal Q of the D-type flip flop 220. The clock signal 116 is latched by the signal which is equal to the signal 117 inputted to the correction circuit 230, so that the D-type flip flop 220 can output a signal having the previous state of the clock signal 116 outputted from the correction circuit 230. When the signal outputted from the D-type flip flop 220 is High, the previous state of the clock signal 116 is High. When the signal outputted from the D-type flip flop 220 is Low, the previous state of the clock signal 116 is Low. When the signal outputted from the D-type flip flop 220 is High, the reset correction signal 115 can be outputted. When the signal outputted from the D-type flip flop 220 is Low, the set correction signal 114 can be outputted.

When an output of the output terminal Q of the D-type flip flop 220 is Low, an output from the output terminal Q of the D-type flip flop 221 is High, and the correction timing signal 112 is Low, the set correction signal 114 which is an active-low signal is outputted.

When an output from the output terminal Q of the D-type flip flop 220 is High, an output from the output terminal Q of the D-type flip flop 221 is High, and the correction timing signal 112 is Low, the reset correction signal 115 which is an active-low signal is outputted.

Figure 8A:
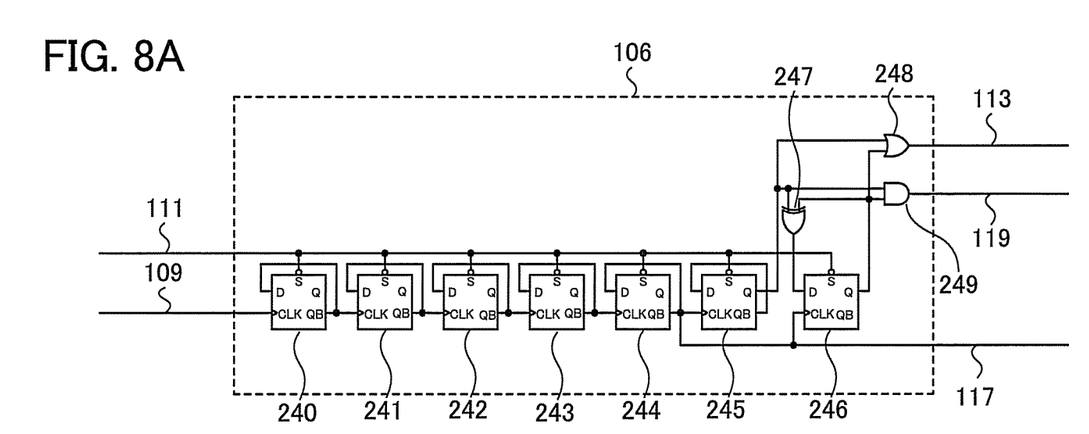
FIGS. 8A and 8B are diagrams each illustrating a specific example of a divider circuit and a correction circuit according to one embodiment of the present invention.

FIG. 8A illustrates an example of the circuit structure of the divider circuit 106. The divider circuit 106 divides the carrier wave 109. The division factor of the divider circuit 106 is set so as to make the pulse width of 109 equal to a half period of the desired clock signal 116. Note that the period of the desired clock signal 116 is substantially equal to two times the width of the modulated pulse of the carrier wave. Therefore, the divider circuit 106 has flip flops (also called frequency dividers) of n stages (n is a natural number). Each of the flip flops of n stages outputs a signal having a half frequency of the signal inputted to an input terminal.

According to the ISO/IEC 15693 standard of the communication system, modulation width for pulse position modulation of a carrier wave with a frequency of 13.56 MHz is approximately 9.44 μs. A half period of 13.56 MHz is about 73.74 ns; therefore, the modulation width for the pulse position modulation is 256 times the half period of 13.56 MHz. When flip flops of 8 stages are connected in cascade, a half pulse with the same width as the modulation width for the pulse position modulation can be obtained. Since the correction circuit 230 which will be described later has a function of dividing by one stage, the divider circuit 106 has flip flops of 7 stages. The case where the divider circuit 106 has the flip flops of 7 stages which are a D-type flip flop 240, a D-type flip flop 241, a D-type flip flop 242, a D-type flip flop 243, a D-type flip flop 244, a D-type flip flop 245, and a D-type flip flop 246 is described below.

D-type flip flops having an asynchronous negative set are employed for the D-type flip flop 240 to 246 of 7 stages. The divider circuit having the D-type flip flops 240 to 244 of 5 stages has a structure of an asynchronous divider circuit. In the case where the divider circuit having 5 stages is a synchronous divider circuit, a terminal CLK of the D-type flip flop 240 is electrically connected to terminals CLK of the D-type flip flops 241 to 244, which are in lower stages, thereby increasing power consumption. Although the divider circuit having the D-type flip flops 240 to 244 of 5 stages has a structure of an asynchronous divider circuit in order to reduce power consumption, a structure of a synchronous divider circuit may be employed if power consumption is not considered.

Among the divider circuit 106 which is a divider circuit having 7 stages, the D-type flip flop 245 and the D-type flip flop 246 of 2 stages are synchronous divider circuit because the D-type flip flop 245 and the D-type flip flop 246 need to be synchronized with the correction circuit 230 and relate to the judgement timing signal 113 which is to be inputted to the correction judgement circuit 108, and the count-up signal 119 which is to be inputted to the correction circuit 230.

An output terminal QB of each of the first stage D-type flip flop 240 to the fifth stage D-type flip flop 244 is electrically connected to a terminal CLK of the D-type flip flop in the next stage. A signal outputted from an output terminal Q and the output terminal QB are inverted at the same time as a timing of rise of a signal inputted to the terminal CLK.

Each of the terminals CLK of the sixth stage D-type flip flop 245 and seventh stage D-type flip flop 246 is electrically connected to the output terminal QB of the fifth stage D-type flip flop 244. The terminal D of the sixth stage D-type flip flop 245 is electrically connected to an output terminal QB of the sixth stage D-type flip flop 245. A signal obtained by performing EXOR operation on a signal outputted from an output terminal Q of the sixth stage D-type flip flop 245, and a signal outputted from an output teiininal Q of the seventh stage D-type flip flop 246 in an EXOR circuit 247 is inputted to the terminal D of the seventh D-type flip flop 246. Accordingly, the seventh D-type flip flop 246 is included in a divide-by-2 circuit synchronized with the rising of the signal outputted from the output terminal QB of the fifth stage D-type flip flop 244.

A signal from the output terminal Q of the sixth stage D-type flip flop 245 and a signal from the output terminal Q of the seventh stage D-type flip flop 246 are inputted to the OR circuit 248 in which OR operation is performed on those signals. An output signal obtained by OR operation is outputted as the judgement timing signal 113. The signal from the output terminal Q of the sixth stage D-type flip flop 245 and the signal from the output terminal Q of the seventh stage D-type flip flop 246 are inputted to the AND circuit 249. AND operation is performed on those signals. An output obtained by the AND operation is outputted as the count-up signal 119.

Figure 8B:
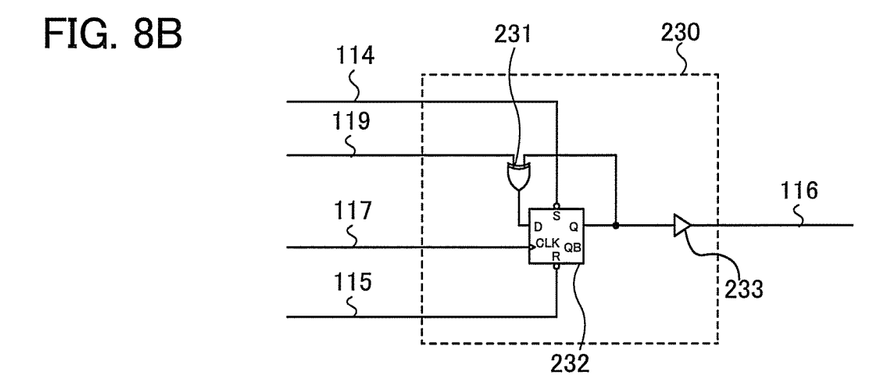

FIG. 8B illustrates an example of a circuit structure of the correction circuit 230. The set correction signal 114, the reset correction signal 115, the count-up signal 119, and the signal 117 are inputted to the correction circuit 230, and the correction circuit 230 generates the clock signal 116.

The correction circuit 230 shown in FIG. 8B has a D-type flip flop 232, an EXOR circuit 231, and a buffer 233. The D-type flip flop 232 is a D-type flip flop with the asynchronous negative set and the asynchronous negative reset.

The count-up signal 119 is inputted to one of two input terminals of the EXOR circuit 231, and the other is electrically connected to an output terminal Q of the D-type flip flop 232. A terminal D of the D-type flip flop 232 is electrically connected to an output of the EXOR circuit 231, and the signal 117 is inputted to a terminal CLK of a D-type flip flop 232.

The set correction signal 114 is inputted to a terminal S of the D-type flip flop 232, and the correction signal 115 is inputted to a terminal R of the D-type flip flop 232. An input of the buffer 233 is electrically connected to the terminal Q of the D-type flip flop 232. An output of the buffer 233 is outputted as the clock signal 116.

The EXOR circuit 231 and the D-type flip flop 232 form one stage of synchronous divider circuit. Since the count-up signal 119 and signal 117 outputted from the divider circuit 106 are inputted to the synchronous divider circuit, the synchronous divider circuit is a divider circuit in an eighth stage together with the divider circuit 106. The synchronous divider circuit functions as a synchronous divider circuit when the set correction signal 114 or the reset correction signal 115 is not inputted.

When the set correction signal 114 is an active-low signal, the termianal Q of the D-type flip flop 232 is High, and in a set state. The terminal Q of the D-type flip flop 232 is electrically connected to the buffer 233, so that the clock signal 116 which is an output signal of the buffer 233 is High. In addition, when the reset correction signal 115 is an active-low signal, the terminal Q of the D-type flip flop 232 is Low, and in a reset state. The clock signal 116 is in a reset state, in other words, it is Low. The terminal Q of the D-type flip flop 232 is electrically connected to the buffer 233, so that the clock signal 116 which is an output signal of the buffer 233 is Low.

The state of the output signal of the D-type flip flop 232 is forced to change by the set correction signal 114 and the reset correction signal 115. The clock signal 116 obtained in such a manner does not have a longer pulse width and can generate the clock signal 116 having a constant period at some level which is necessary for the circuit following after.

Note that this embodiment can be freely combined with any one of the other embodiments.

Example 1

Figure 9:
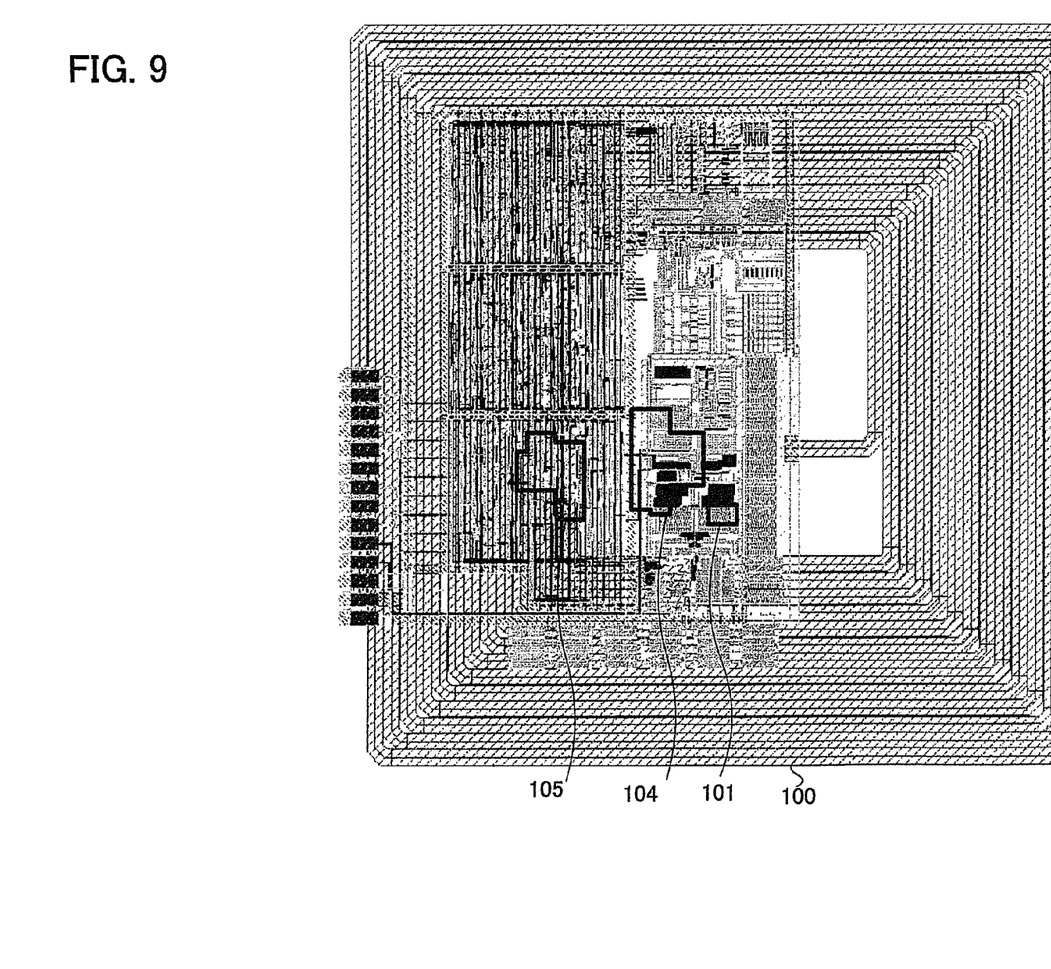
FIG. 9 is a diagram illustrating a layout of a semiconductor device according to one embodiment of the present invention.

An example of a semiconductor device that is one embodiment of the present invention shown in FIG. 1, which is actually manufactured is described. FIG. 9 illustrates a layout of the semiconductor device that is one embodiment of the present invention, and corresponds to a mask layout of a photomask. In FIG. 9, the same portions as those in FIG. 1 are denoted by the same reference numerals and description thereof is omitted.

Example 1 can be freely combined with the first embodiment to the ninth embodiment.

This application is based on Japanese Patent Application serial no. 2008-252073 filed with Japan Patent Office on Sep. 30, 2008, the entire contents of which are hereby incorporated by reference.

The invention claimed is:

1. A semiconductor device comprising:
a clock generation circuit which generates a clock signal, including:
a divider circuit configured to output a judgement timing signal and a first divided signal by dividing a carrier wave;
a correction judgement circuit configured to output a set correction signal and a reset correction signal, and
a correction circuit configured to output a second divided signal by dividing the first divided signal,
wherein the correction circuit has a function of performing a correction for inverting the second divided signal in a period corresponding to a half period of the clock signal by using the set correction signal or the reset correction signal, and
wherein the correction judgement circuit is configured to select whether the correction is performed or not in accordance with the judgement timing signal.

2. The semiconductor device according to claim 1, wherein the period of the first divided signal corresponds to the half period of the clock signal.

3. The semiconductor device according to claim 1, wherein the clock signal having a constant period is generated in both cases of 100% modulation and 10% modulation.

4. The semiconductor device according to claim 1, wherein a 100% modulation and a 10% modulation are switched to modulate the carrier wave.

5. The semiconductor device according to claim 1, wherein the semiconductor device conforms to the ISO/IEC15693 communication standard.

6. The semiconductor device according to claim 1, wherein the divider circuit and the correction circuit each includes D-type flip flop.

7. The semiconductor device according to claim 1, wherein the semiconductor device is an RFID tag.

8. A semiconductor device comprising:
a clock generation circuit which generates a clock signal, including:
a divider circuit configured to output a judgement timing signal and a first divided signal by dividing a carrier wave;
a signal generation circuit configured to output, an initial synchronization signal, and a correction timing signal;
a correction judgement circuit configured to output a set correction signal and a reset correction signal based on the initial synchronization signal and the correction timing signal; and
a correction circuit configured to output a second divided signal by dividing the first divided signal,
wherein the correction circuit has a function of performing a correction for inverting the second divided signal in a period corresponding to a half period of the clock signal by using the set correction signal and the reset correction signal, and
wherein the correction judgement circuit is configured to select whether the correction is performed or not in accordance with the judgement timing signal.

9. The semiconductor device according to claim 8, wherein the period of the first divided signal corresponds to the half period of the clock signal.

10. The semiconductor device according to claim 8, wherein the clock signal having a constant period is generated in both cases of 100% modulation and 10% modulation.

11. The semiconductor device according to claim 8, wherein a 100% modulation and a 10% modulation are switched to modulate the carrier wave.

12. The semiconductor device according to claim 8, wherein the semiconductor device conforms to the ISO/IEC15693 communication standard.

13. The semiconductor device according to claim 8, wherein the divider circuit and the correction circuit each includes D-type flip flop.

14. The semiconductor device according to claim 8, wherein the semiconductor device is an RFID tag.

15. The semiconductor device according to claim 8,
wherein the signal generation circuit is configured to output a synchronization signal, and
an operating timing of the divider circuit is determined in accordance with the synchronization signal.

16. A semiconductor device comprising:
a demodulation circuit configured to output a demodulated signal based on a carrier wave; and
a clock generation circuit which generates a clock signal, including:
a divider circuit configured to output a judgement timing signal and a first divided signal by dividing the carrier wave;
a signal generation circuit configured to output, an initial synchronization signal, and a correction timing signal based on the demodulated signal;
a correction judgement circuit configured to output a set correction signal and a reset correction signal based on the initial synchronization signal and the correction timing signal; and
a correction circuit configured to output a second divided signal by dividing the first divided signal,
wherein the correction circuit has a function of performing a correction for inverting the second divided signal in a period corresponding to a half period of the clock signal by using the set correction signal and the reset correction signal, and
wherein the correction judgement circuit is configured to select whether the correction is performed or not in accordance with the judgement timing signal.

17. The semiconductor device according to claim 16, wherein the period of the first divided signal corresponds to the half period of the clock signal.

18. The semiconductor device according to claim 16, wherein the clock signal having a constant period is generated in both cases of 100% modulation and 10% modulation.

19. The semiconductor device according to claim 16, wherein a 100% modulation and a 10% modulation are switched to modulate the carrier wave.

20. The semiconductor device according to claim 16, wherein the semiconductor device conforms to the ISO/IEC15693 communication standard.

21. The semiconductor device according to claim 16, wherein the divider circuit and the correction circuit each includes D-type flip flop.

22. The semiconductor device according to claim 16, wherein the semiconductor device is an RFID tag.

23. The semiconductor device according to claim 16,
wherein the signal generation circuit is configured to output a synchronization signal, and
an operating timing of the divider circuit is determined in accordance with the synchronization signal.

* * * * *